United States Patent [19]
Duan

[11] Patent Number: 5,874,705
[45] Date of Patent: Feb. 23, 1999

[54] METHOD OF AND APPARATUS FOR MICROWAVE-PLASMA PRODUCTION

[75] Inventor: Xiaoming Duan, Cheshire, United Kingdom

[73] Assignee: EA Technology Limited, Chester, United Kingdom

[21] Appl. No.: 765,877

[22] PCT Filed: Jul. 11, 1995

[86] PCT No.: PCT/GB95/01628

§ 371 Date: Apr. 8, 1997

§ 102(e) Date: Apr. 8, 1997

[87] PCT Pub. No.: WO96/02934

PCT Pub. Date: Feb. 1, 1996

[30] Foreign Application Priority Data

Jul. 19, 1994 [GB] United Kingdom ................. 9414561.2

[51] Int. Cl.⁶ .................................................. B23K 10/00
[52] U.S. Cl. ............................. 219/121.43; 219/121.41; 219/121.59; 156/345; 204/298.37
[58] Field of Search ................. 219/121.43, 121.41, 219/121.54, 121.57, 121.52, 121.36, 121.59; 156/345, 643.1, 646.1; 204/298.37, 298.38

[56] References Cited

U.S. PATENT DOCUMENTS

| | | |
|---|---|---|
| 3,577,207 | 5/1971 | Kirjushin .................................. 315/39 |
| 4,609,808 | 9/1986 | Bloyet et al. ....................... 219/121.52 |
| 4,883,570 | 11/1989 | Efthimion et al. ....................... 204/164 |
| 5,023,056 | 6/1991 | Aklufi et al. ............................. 422/186 |
| 5,205,912 | 4/1993 | Murphy .............................. 204/157.15 |
| 5,270,515 | 12/1993 | Long ..................................... 219/121.4 |
| 5,468,296 | 11/1995 | Patrick et al. .................... 118/723 MP |
| 5,565,118 | 10/1996 | Asquith et al. ..................... 219/121.57 |

FOREIGN PATENT DOCUMENTS

| | | |
|---|---|---|
| 0 267 513 | 5/1988 | European Pat. Off. . |
| 0 295 083 | 12/1988 | European Pat. Off. . |
| 0 325 227 | 7/1989 | European Pat. Off. . |
| 0 436 353 A1 | 7/1991 | European Pat. Off. . |
| 2151021 | 6/1990 | Japan . |
| 810055 | 11/1984 | U.S.S.R. . |
| 2 259 185 | 3/1993 | United Kingdom . |
| WO 94/05825 | 3/1994 | WIPO . |

*Primary Examiner*—Mark H. Paschall
*Attorney, Agent, or Firm*—Westman, Champlin & Kelly, P.A.

[57] ABSTRACT

A microwave-plasma apparatus produces a plasma substantially at or above atmospheric pressure. A vessel contains gas substantially at or above atmospheric pressure and a plasma once initiated. Microwave energy is radiated into said vessel to produce a plasma therein. The plasma is initiated. The vessel is shaped to confine said plasma in a volume to prevent dissipation of said plasma once initiated, and the device for radiating microwave energy includes a power controller to control the power level of the microwave energy to sustain said plasma once initiated.

25 Claims, 2 Drawing Sheets

METHOD OF AND APPARATUS FOR MICROWAVE-PLASMA PRODUCTION

The present invention relates to method of and apparatus for producing a plasma substantially at or above atmospheric pressure using microwave energy.

The use of microwave generated plasma has found a wide range of applications in the synthesis of new materials and in materials surface engineering. For instance, U.S. Pat. No. 4,897,285, U.S. Pat. No. 4,664,937 and U.S. Pat. No. 4,893,584 disclose methods of depositing films or coatings onto a substrate using microwave generated plasma. However, the microwave generated plasma in the prior art is produced using sophisticated equipment requiring a high intensity microwave field and a low plasma pressure environment. The requirement for such sophisticated equipment and the necessity for the use of vacuum techniques has led to a high capital cost of microwave processes.

A microwave plasma apparatus is disclosed in EP-A-0435591 in which a methane gas is contained within a microwave field for conversion to acetylene, ethylene and hydrogen. Electrically conductive elongate particles are placed and maintained in the field to act as plasma initiators and catalysts for the reaction. This arrangement suffers from the disadvantage that the initiators fouled during the reaction and as disclosed in EP-A-0436363 they require regeneration.

The object of the present invention is to provide a simpler and cheaper microwave-plasma apparatus and a method of generating a plasma using microwave energy which does not require the maintenance of a low pressure in the vessel or the use of such catalysts to sustain a plasma substantially at or above atmospheric pressure.

SUMMARY OF THE INVENTION

The present invention provides a microwave-plasma apparatus for producing a plasma substantially at or above atmospheric pressure, comprising a vessel for containing gas substantially at or above atmospheric pressure and a plasma once initiated, means for radiating microwave energy into said vessel to produce a plasma therein; and means for initiating said plasma; wherein said vessel is shaped to confine said plasma in a volume to prevent dissipation of said plasma once initiated, and said means for radiating microwave energy includes power control means to control the power level of the microwave energy to sustain said plasma once initiated.

The present invention also provides a method of producing a plasma substantially at or above atmospheric pressure using microwave energy, the method comprising the steps of radiating microwave energy into a vessel containing a gas to initiate a plasma therein; confining said plasma in a volume in said vessel to prevent dissipation of said plasma; radiating further microwave energy into said vessel to sustain said plasma, wherein the radiation of further microwave energy is controlled to control the power level of the microwave energy to sustain said plasma once initiated.

The present invention is thus able to sustain a plasma substantially at or above atmospheric pressure after it has been initiated, by confining the plasma in a volume to prevent its dissipation and controlling the application of microwave power to the plasma. In order to sustain the plasma it is necessary to keep the microwave power density high enough to sustain the plasma. Therefore, the microwave power cannot be pulsed in such a manner that the microwave power is switched off for a long enough period for the plasma to extinguish since this will require the re-initiation of the plasma. The plasma is therefore preferably sustained by the continuous application of microwave energy, although the applied microwave energy can be pulsed so long as the off part of the duty cycle is not too long.

In order to provide an arrangement for the continuous feeding of gas into the microwave plasma, the microwave plasma apparatus preferably includes inlet means for introducing gas into the vessel and exhaust means for removing exhaust gas from the vessel.

The vessel is preferably substantially spherical and formed of a refractory material. The material is conveniently a dielectric non-conductive material. Conveniently the vessel can be formed of quartz.

In one embodiment the vessel can be contained within a microwave cavity or waveguide. In an alternative embodiment the vessel can be formed by the walls of a microwave cavity or waveguide.

According to one embodiment of the present invention initiation of the plasma can be achieved using an electrically conductive electrode means provided in the vessel which is adapted to concentrate the microwave field to provide a sufficient microwave field strength to initiate a plasma. The electrode means is arranged to be separable from the plasma once the plasma has been initiated.

Preferably the electrode means is arranged to be removable from within the vessel once the plasma has been initiated. In this way the initiator is removed from the microwave field and does not interfere with the plasma which is sustained without the initiator being present. The removal of the electrode means is preferable since this prevents distortion of the microwave field and a more stable plasma is produced.

In an alternative embodiment of the present invention the electrode means is arranged in a lower part of the vessel and the vessel is shaped such that once the plasma is initiated the plasma floats upwards away from the electrode means. In this way the electrode means does not interact with the plasma during the sustaining of the plasma after initiation and therefore the electrode means is not subjected to the hostile environment of the plasma for long periods.

Electrode means preferably comprises an elongate member which has a sharp tip which extends into the vessel.

According to one embodiment of the present invention the electrode means can be adapted to be vaporised by the plasma during initiation of said plasma and in this way there is no initiator left in the vessel whilst the plasma is sustained.

The electrode means can conveniently be formed of any electrically conductive material such as carbon, carbon fibres or a metal. The use of carbon as a material for the electrode means has advantages since the vaporization of the carbon electrode by the plasma during initiation, will generate carbon dioxide as opposed to a metal electrode which would vaporize and provide a metal coating within the vessel. The special coating can be undesirable since it will interfere with the microwave field within the vessel.

In accordance with another embodiment of the present invention initiation of the plasma is achieved using vacuum means for lowering the pressure in the vessel until a pressure is reached in the vessel at which a plasma can be initiated spontaneously by the radiation of microwave energy into the vessel. Once the plasma is initiated pressurising means gradually raises the pressure within the vessel until the pressure in the vessel is substantially at or above atmospheric pressure. During the gradual increase of pressure in the vessel, the plasma is compressed into an upper region of the vessel. The vessel confines the plasma and it is sustained by this confinement and by the control of the power level of the microwave energy.

BRIEF DESCRIPTION OF THE DRAWINGS

Embodiments of the present invention will now be described with reference to the accompanying drawings, in which.

DETAILED DESCRIPTION OF THE PREFERRED EMBODIMENTS

Figure 1:
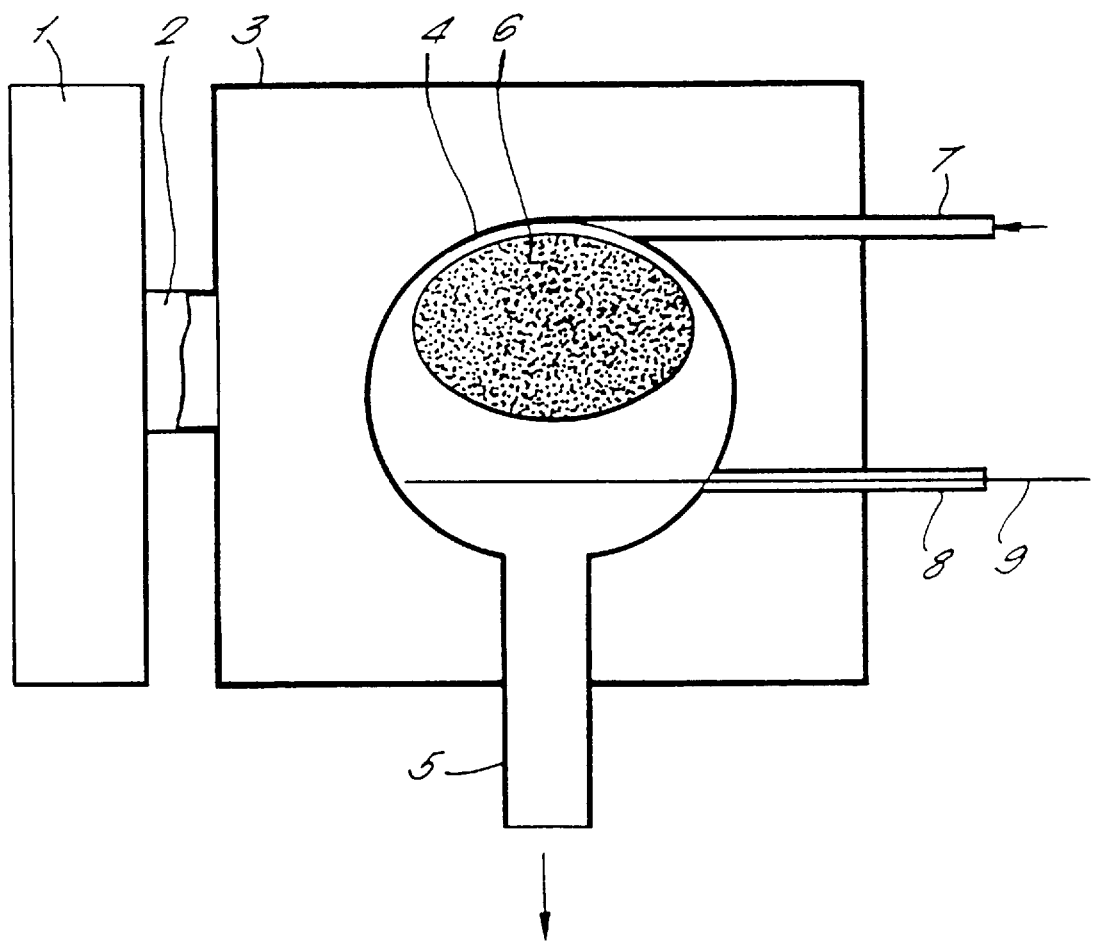
FIG. 1 is a schematic illustration of a microwave plasma apparatus according to one embodiment of the present invention.

In FIG. 1 the microwave-plasma apparatus comprises a microwave source 1 which is coupled to a microwave cavity 3 by a waveguide 2. Within the microwave cavity 3 is provided a quartz vessel 4. The quartz vessel 4 is provided with a gas inlet 7 through which gas is introduced into the quartz vessel 4. The quartz vessel 4 is also provided with an exhaust port 5 for removal of the exhaust gases from the quartz vessel 4. The quartz vessel 4 is further provided with an ignition port 8 through which an electrode 9 can be inserted and removed.

The electrode 9 is an elongate member having a tip which forms a sharp end. The electrode 9 is formed of an electrically conductive material. Carbon in the form of carbon fibres has been found to be a suitable electrode material since once a plasma has been initiated within the vessel, vaporization of the carbon electrode will result in the production of carbon dioxide which will not affect the microwave field within the quartz vessel 4.

The operation of the apparatus illustrated in FIG. 1 will now be described.

The gas which is to form the medium for the plasma is introduced into the quartz vessel 4 by the gas inlet 7. The electrode 9 is inserted into the quartz vessel 4 and the microwave source 1 is switched on to generate a microwave field within the quartz vessel 4. The presence of the electrode 9 within quartz vessel 4 results in an increased microwave field strength at a position adjacent the tip of the electrode 9. Once the microwave field strength in this region is sufficiently high a discharge starts causing ionisation of the surrounding atmosphere. A plasma ball 6 is then formed and floats to the top of the quartz vessel 4. Having initiated the plasma the electrode 9 can then be withdrawn from the quartz vessel 4. The size of the plasma environment 6 inside the quartz vessel 4 can be controlled by controlling the power level of the microwave source 1. If the power from the microwave source 1 is increased then the size of the plasma environment 6 increases. If the power from the microwave source 1 is decreased then the size of the microwave environment 6 will decrease and if it decreases too much then the plasma will extinguish once the energy density absorbed from the microwaves is too low.

The gas supplied into the quartz vessel 4 by the gas inlet 7 is provided close to or above atmospheric pressure and this fuels the plasma environment 6. Gases which have reacted within the plasma are then removed from the quartz vessel 4 via the exhaust port S.

The microwave power which typically is required to generate the plasma environment 6 is 600 W to 2 kW. The plasma temperature can be several hundred degrees centigrade.

In view of the high temperatures reached by the plasma within the vessel the walls of the vessel are made of a refractory material which in the illustrated embodiment is quartz.

The provision of the quartz vessel 4 within the microwave cavity 3 is the preferred embodiment since this provides the plasma environment 6 within the central portion of the microwave cavity 3.

In an alternative embodiment of the present invention the microwave cavity 3 could comprise the vessel containing the plasma environment 6. In such an arrangement the walls of the microwave cavity must be formed of a refractory material.

The present invention can be applied readily to the treatment of large volumes of gaseous emissions containing low levels of noxious species. For example 1) Volatile organic compounds containing gases can be treated. Such are waste materials from the chemical industry, waste processing, foundries, paint spraying and from industrial cleaning using solvents.

2) Flue gas emissions containing NOx and SOx can be treated.

3) Gases can be treated to remove unpleasant odours.

4) Cleaning of surfaces.

5) Coating of surfaces.

6) Generation of ozone.

Conventional incineration technologies do not effectively destroy low concentrations of noxious species in a high volume of gas, since self-sustained combustion is difficult. The added fuel costs to achieve this can be prohibitively expensive.

Destruction of noxious species can be effected if these gaseous emissions are passed through the plasma environment described hereinabove before final exhaust. Because the device can operate at atmospheric pressure adequate gas flows can be achieved.

1. Treatment of Volatile Organic Compounds (VOCs)

a) Toluene/air mixture was fed through the quartz chamber 4 of FIG. 1 at a flow rate of 1 l/min. The microwave power applied was 1.3 kW. The measured toluence concentration in the inlet 7 was 1,000 ppm. Measurements of the toluene in the exhaust gas from the exhaust 5 failed to detect any toluene content.

b) Acetone/air mixtures was fed through the quartz chamber 4 of FIG. 1 at a flow rate of 2 l/min. The microwave power applied was 1.3 kW. The measured acetone concentration in the inlet 7 was 200 ppm. Measurements of the acetone in the exhaust gas from the exhaust 5 failed to detect any acetone content.

2. Surface Coating of Polymer Insulator

Titanium dioxide provides a good barrier coating, offering high resistance to chemical attack while also having good insulation properties. An embodiment of the present invention was therefore developed to use titanium oxide to coat polymer insulators to improve their weather resistance.

Titanium dioxide is conventionally produced by oxidation of the commonly available reagent titanium tetrachloride in the following reaction:

$$TiCl_4 + O_2 \rightarrow TiO_2 + 2Cl_2.$$

This reaction can be achieved with thermal energy, but the advantage of using the plasma technique in accordance with the present invention is that the reaction temperature is reduced to a level compatible with the polymer substrate material.

Figure 2:
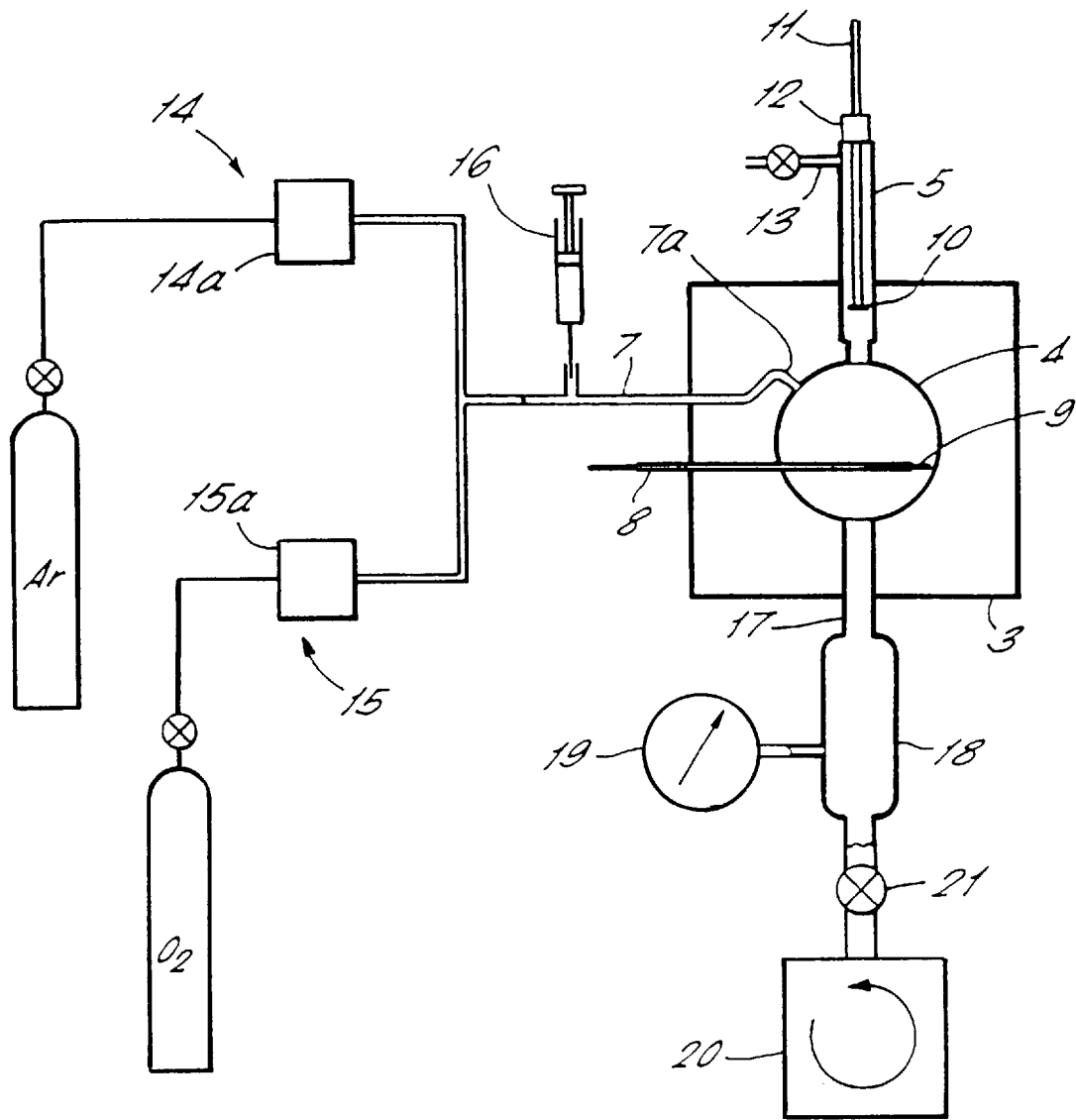
FIG. 2 is a schematic illustrated of a microwave plasma apparatus to another embodiment of the present invention.

The arrangement used for the titanium coating of a polymer substrate is illustrated in FIG. 2. In Figure The arrangement used for the titanium coating of a polymer substrate is illustrated in FIG. 2. In FIG. 2 the same reference numerals have been used for the same components as illustrated in the schematic arrangement of FIG. 1.

In FIG. 2 the exhaust port 5 comprises a vertical tube of 15 mm internal diameter which penetrates the top of the cavity 3 to take advantage of the natural tendency of the hot gases to rise. A hole of this size does not present a radiation hazard since it acts as a choke to the microwave signals of the standard frequency of 2,450 MHz. A circular polymer sample 10, of diameter 8 mm, is temporarily bonded onto the end of a ceramic rod 11 which passes through a seal 12 at the top of the exhaust port 5, allowing a relative height of the sample 10 to be adjusted to a position either within or outside the cavity 3. Because this arrangement blocks the end of the exhaust port 5, a route for the exit of the exhaust gases is provided in a valved side arm 13 downstream of (and therefore above) the sample 10.

Two side entries to the quartz chamber 4 are provided. The upper one comprises the inlet port 7 for the introduction of the reactants. The inlet port 7 incorporates a downward section 7a to prevent the plasma spreading back along the inlet tube 7 due to the thermal effects. The lower port 8 is for the insertion and withdrawal of the electrode 9 which is used to initiate the plasma. If the electrode 9 is allowed to remain within the flask there is a risk that the evaporation of the electrode could contaminate the plasma and there is also a risk of overheating.

The inlet port 7 is fed from two separate gas lines 14 and 15 each of which comprises a supply of gas (argon or oxygen) and a mass flow controller 14a and 15a respectively. This allows for a single gas or a combination of gases to be fed at predetermined rates. The titanium tetrachloride reagent to be used is a moisture-sensitive liquid with a vapour pressure of 9 Torr at 20° C. This is injected into the incoming gas stream in the inlet port 7 using the syringe arrangement 16. The titanium tetrachloride reagent is transported both as vapour and as droplets into the plasma where the reaction is initiated. The inlet port 7 can be heated at the point of injection in order to increase the vapour pressure of the titanium tetrachloride, and hence its rate of delivery to the plasma. Because titanium tetrachloride can be dangerous if inhaled, the apparatus is enclosed in a perspex booth which is continuously extracted.

Although the plasma operates at atmospheric pressure, a vacuum port 17 is also provided connected to the bottom of the quartz chamber 4 and to an intermediate volume 18 which is fitted with a pressure transducer. The other side of the intermediate volume 18 is connected to a vacuum pump 20 via a valve 21. This allows for the purging of the quartz chamber 4 and provides an alternative means of plasma generation as will be described hereinafter. A rough vacuum is adequate for these purposes and is generated by a two-stage rotary pump 20. The pressure within the vessel 4 can be monitored by the pressure gauge 19.

In standard microwave heating systems, the actual power is controlled by intermittently interrupting the magnetron at full power: the average effective power level being determined by the relative times for which the magnetron is either on or off. Since this is done on a time scale which is very long in comparison to plasma generation parameters, if the magnetrons are switched off, even if only briefly, the plasma is extinguished. Therefore, the power supply to the magnetrons was modified to incorporate Variacs to control the amplitude of the power supply to the magnetrons. This entailed triggering various built-in trips, but without compromising the safety features.

The experimental parameters in the arrangement of FIG. 2 are indicated below:
Sample size: 8 mm diameter polymer concrete, 5 mm square silicon wafer
Sample position: 25 mm to 120 mm long exhaust port 5
Oxygen flow rate: 0.5 to 5 standard litres/minute
Argon flow rate: 0 to 0.1 standard litres/minute
$TiCl_4$ delivery rate: trace amounts to 1 cc/minute
Power level: 50% to 100% of full power:

Under these conditions coatings ranging in thickness for 0.5 microns to 3 microns was deposited on the polymer concrete substrates. The mean surface roughness of the coatings measured was about 0.3 microns showing a marked improvement over the untreated insulator which returned a value of 0.6 microns.

The fine indicator of the functional properties of the coatings was the water droplets test. The uniformity of the droplet surface reflects the coating quality, while high contact angles denote good hydrophobicity and implies low porosity. For a 10 microlitre droplet, values as high as 138° were obtained. This compared favourably to the untreated material which gave an angle of about 60°.

Alternative Method of Initiating the Plasma

A plasma substantially at or above atmospheric pressure can be initiated in an alternative embodiment by reducing the pressure in the vessel 4 to a low enough pressure whereby radiation of the low pressure gas within the vessel causes the spontaneous generation of the plasma. In the arrangement shown in FIG. 2 the vacuum plasma. In the arrangement shown in FIG. 2 the vacuum pump 20 can be used to reduce the pressure within the vessel 4 and control is provided by the valve 21. In this embodiment electrode 9 is not required.

Once the plasma is initiated in the vessel 4, the pressure within the pressure 4 is increased gradually by allowing gas in through gas lines 14 or 15 until the pressure within the vessel is at the required pressure which is substantially at or above atmospheric pressure.

As the pressure is gradually increased within the vessel the plasma volume gradually reduces to the top of the vessel. The plasma is thus sustained by the confinement of plasma within the vessel and the control of the application of microwave power.

I claim:

1. A microwave plasma apparatus for producing a plasma substantially at or above atmospheric pressure, comprising a vessel for containing gas substantially at or above atmospheric pressure and for containing a plasma once initiated, a microwave energy supply for delivering microwave energy into said vessel to maintain a plasma therein and means for initiating a plasma in the vessel;

said vessel having a roof and sides whereby a volume of plasma formed and maintained in said vessel floats in said vessel and is trapped under said roof and between said sides of the vessel; and said microwave energy supply having a microwave power control to control the microwave power being delivered to said vessel to be a value not less than the power absorbed by said trapped volume of plasma which is required to maintain said trapped plasma volume constant when substantially at or above atmospheric pressure.

2. Microwave plasma apparatus as claimed in claim 1 including inlet means for introducing said gas into said vessel, and exhaust means for removing exhaust gas from said vessel.

3. Microwave plasma apparatus as claimed in claim 1 or claim 2 wherein said power control means is arranged to apply the microwave energy continuously to sustain said plasma.

4. Microwave plasma apparatus as claimed in claim 1 wherein said vessel is formed of a refractory material.

5. Microwave plasma apparatus as claimed in claim 4 wherein said vessel is formed by walls of a microwave cavity.

6. Microwave plasma apparatus as claimed in claim 4 wherein said vessel is formed of an electrically non-conductive material and is contained within a microwave cavity or waveguide.

7. Microwave plasma apparatus as claimed in claim 1 wherein said vessel is formed of quartz.

8. A microwave plasma apparatus as claimed in claim 1 wherein said means for initiating comprises electrically conductive electrode means provided in said vessel and adapted to concentrate the microwave field to provide a sufficient microwave field strength to initiate a plasma, wherein said electrode means is arranged to be separable from the plasma once the plasma has been initiated.

9. A microwave plasma apparatus as claimed in claim 8 wherein said electrode means is arranged to be removable from within said vessel once a plasma has been initiated.

10. A microwave plasma apparatus as claimed in claim 8 wherein said electrode means is arranged in a lower part of said vessel, and said vessel is shaped such that once said plasma is initiated said plasma floats upwards away from said electrode means.

11. Microwave plasma apparatus as claimed in claim 8 wherein said electrode means comprises an elongate member having a tip extending into said vessel.

12. Microwave plasma apparatus as claimed in claim 11 wherein said tip has a sharp end.

13. Microwave plasma apparatus as claimed in claim 8 wherein said electrode means is adapted to be vaporised by said plasma during initiation of said plasma.

14. Microwave plasma apparatus as claimed in claim 8 wherein said electrode means is formed of carbon.

15. Microwave plasma apparatus as claimed in claim 8 wherein said electrode means is formed of one or more carbon fibres.

16. Microwave plasma apparatus as claimed in claim 8, wherein said electrode means is formed of a metal.

17. Microwave plasma apparatus as claimed in claim 1 wherein said means for initiating comprises vacuum means for lowering the pressure in said vessel until a pressure is reached in said vessel at which a plasma is initiated by the radiation of microwave energy into said vessel; and pressurizing means for gradually raising the pressure within said vessel once said plasma has been initiated until the pressure in said vessel is substantially at or above atmospheric pressure.

18. A method of producing a plasma substantially at or above atmospheric pressure using microwave energy, the method comprising the steps of delivering microwave energy into a vessel containing a gas to initiate a plasma therein; using a roof and sides of said vessel to trap a volume of plasma floating in said vessel, and subsequently controlling the microwave power delivered to the vessel to be a value not less than the power absorbed by said trapped volume of plasma which is required to maintain said trapped plasma volume constant when substantially at or above atmospheric pressure.

19. A method as claimed in claim 18 including the steps of introducing gas into said vessel and removing exhaust gas from said vessel.

20. A method as claimed in claim 18 wherein the microwave energy is applied continuously to sustain said plasma.

21. A method as claimed in claim 18 including the steps of providing an electrically conductive electrode means in said vessel during the radiation of microwave energy into said vessel to initiate a plasma, and separating said electrode means from said plasma once said plasma has been initiated.

22. A method as claimed in claim 21 wherein the step of separating comprises removing said electrode means from said vessel once said plasma has been initiated.

23. A method as claimed in claim 21 wherein the step of separating comprises the step of vaporizing said electrode means.

24. A method as claimed in claim 21 wherein said electrode means is arranged in a lower part of said vessel, and said plasma, once initiated, floats away from said electrode means.

25. A method as claimed in claim 18 including the steps of lowering the pressure in said vessel prior to radiating microwave energy into said vessel, until a pressure is reached in said vessel at which a plasma can be initiated by the application of microwave energy, plasma then being initiated by the step of radiation of microwave energy into said vessel; and gradually raising the pressure in said vessel once said plasma has been initiated until the pressure in said vessel is substantially at or above atmospheric pressure.

\* \* \* \* \*